United States Patent [19]
Kim et al.

[11] Patent Number: 5,949,356
[45] Date of Patent: Sep. 7, 1999

[54] HIGH SPEED VARIABLE LENGTH CODE DECODER

[75] Inventors: Su Hwan Kim, Seoul; Seong Ok Bae, Kyungki-do, both of Rep. of Korea

[73] Assignee: LG Electronics, Inc., Seoul, Rep. of Korea

[21] Appl. No.: 08/771,830

[22] Filed: Dec. 23, 1996

[30] Foreign Application Priority Data

Mar. 25, 1996 [KR] Rep. of Korea ................. 8150/1996

[51] Int. Cl.⁶ .................................................. H03M 7/40
[52] U.S. Cl. .............................................. 341/67; 341/65
[58] Field of Search ........................... 341/67, 65, 63

[56] References Cited

U.S. PATENT DOCUMENTS

| | | | |
|---|---|---|---|
| 5,233,348 | 8/1993 | Pollmann et al. | 341/67 |
| 5,245,338 | 9/1993 | Sun | 341/67 |
| 5,625,356 | 4/1997 | Lee et al. | 341/67 |
| 5,677,690 | 10/1997 | Sohn | 341/67 |
| 5,696,507 | 12/1997 | Nam | 341/67 |
| 5,781,135 | 7/1998 | Kim et al. | 341/67 |

*Primary Examiner*—Howard L. Williams
*Assistant Examiner*—Peguy Jean Pierre

[57] ABSTRACT

Improved variable code length decoder is disclosed, including a storage part for temporary storage and production of an encoded code word in response to a read signal, a switching part for selective production of the code words from the storage part in response to a switching signal, a barrel shifter for shifting a decoding output window thereon in response to a shift signal in producing a predetermined number of bits of the code word from the switching part for decoding, a storage part for temporary storage and production of the code word from the barrel shifter, a table for producing a decoded code word and a bit length of the code word of the predetermined number of bits stored in the storage part, and a control signal generating part for using the bit length of a code word at the present clock received from the table in generating the switching signal, the shift signal and the read signal.

24 Claims, 6 Drawing Sheets

FIG.4 received bit stream

| clock | latch D0 | latch D1 | latch D2 | latch D3 | first multiplexer | second multiplexer | output from barrel shifter | read | adder | actual shift value | forcibly applied initial value | buffer output | carry |
|---|---|---|---|---|---|---|---|---|---|---|---|---|---|
| 0 | | | | | | | | 1 | | | | | |
| 1 | | | $a_7$-$a_8$$b_7$-$b_6$$c_7$-$c_2$ | | | $a_7$-$a_8$$b_7$-$b_6$$c_7$-$c_2$ | | 1 | | 0 | 16 | $a_7$-$a_8$$b_7$-$b_6$$c_7$-$c_2$ | 1 |
| 2 | | $a_7$-$a_8$$b_7$-$b_6$$c_7$-$c_2$ | $c_3$-$c_5$$d_7$-$d_{13}$ | | $a_7$-$a_8$$b_7$-$b_6$$c_7$-$c_2$ | $c_3$-$c_5$$d_7$-$d_{13}$ | $a_7$-$a_8$$b_7$-$b_6$$c_7$-$c_2$ | 1 | | 0 | 16 | $c_3$-$c_5$$d_7$-$d_{13}$ | 1 |
| 3 | $a_7$-$a_8$$b_7$-$b_6$$c_7$-$c_2$ | $c_3$-$c_5$$d_7$-$d_{13}$ | $d_1$-$d_5$$e_7$-$e_{12}$$f_7$-$f_2$ | $a_7$-$a_8$$b_7$-$b_6$$c_7$-$c_5$$d_7$-$d_5$ | $a_7$-$a_8$$b_7$-$b_6$$c_7$-$c_2$ | $c_3$-$c_5$$d_7$-$d_{13}$ | $b_7$-$b_6$$c_7$-$c_5$$d_7$-$d_5$ | 0 | 14 | 8 | | $d_1$-$d_5$$e_7$-$e_{12}$$f_7$-$f_2$ | 0 |
| 4 | $a_7$-$a_8$$b_7$-$b_6$$c_7$-$c_2$ | $c_3$-$c_5$$d_7$-$d_{13}$ | $d_1$-$d_5$$e_7$-$e_{12}$$f_7$-$f_2$ | $c_7$-$c_5$$d_7$-$d_{11}$ | $a_7$-$a_8$$b_7$-$b_6$$c_7$-$c_2$ | $c_3$-$c_5$$d_7$-$d_{13}$ | $c_7$-$c_5$$d_7$-$d_{11}$ | 0 | 19 | 14 | | | 0 |
| 5 | $c_3$-$c_5$$d_7$-$d_{13}$ | $d_1$-$d_5$$e_7$-$e_{12}$$f_7$-$f_2$ | $d_1$-$d_5$$e_7$-$e_{12}$$f_7$-$f_2$ | $d_7$-$d_{15}$$e_1$ | $c_3$-$c_5$$d_7$-$d_{13}$ | $d_1$-$d_5$$e_7$-$e_{12}$$f_7$-$f_2$ | $d_7$-$d_{15}$$e_1$ | 1 | 3 | 3 | | | 1 |
| 6 | $d_1$-$d_5$$e_7$-$e_{12}$$f_7$-$f_2$ | $f_5$-$f_{10}$$g_7$-$g_8$ | $f_5$-$f_{10}$$g_7$-$g_8$ | $e_7$-$e_{12}$$f_7$-$f_4$ | $d_1$-$d_5$$e_7$-$e_{12}$$f_7$-$f_2$ | $f_5$-$f_{10}$$g_7$-$g_8$ | $e_7$-$e_{12}$$f_7$-$f_4$ | 1 | 2 | 2 | | $f_5$-$f_{10}$$g_7$-$g_8$ | 1 |
| 7 | $d_1$-$d_5$$e_7$-$e_{12}$$f_7$-$f_2$ | $f_5$-$f_{10}$$g_7$-$g_8$ | $g_9$$h_7$-$h_{15}$ | $f_5$-$f_{10}$$g_7$-$g_8$ | $f_5$-$f_{10}$$g_7$-$g_8$ | $f_5$-$f_{10}$$g_7$-$g_8$ | $f_5$-$f_{10}$$g_7$-$g_8$ | 0 | 14 | 14 | | | 0 |
| 8 | $f_5$-$f_{10}$$g_7$-$g_8$ | $f_5$-$f_{10}$$g_7$-$g_8$ | $g_9$$h_7$-$h_{15}$ | $g_7$-$g_9$$h_7$-$h_7$ | $g_9$$h_7$-$h_{15}$ | $g_9$$h_7$-$h_{15}$ | $g_7$-$g_9$$h_7$-$h_7$ | 1 | 8 | 8 | | $g_9$$h_7$-$h_{15}$ | 1 |
| 9 | | $g_9$$h_7$-$h_{15}$ | $h_7$$h_{16}$ | $h_7$-$h_6$ | $h_7$$h_{16}$ | $h_7$$h_{16}$ | $h_7$-$h_6$ | 1 | 1 | 1 | | $h_7$$h_{16}$ | 1 |

HIGH SPEED VARIABLE LENGTH CODE DECODER

BACKGROUND OF THE INVENTION

1. Field of the Invention

The present invention relates to a VLC(Variable Length Code) decoder.

2. Discussion of the Related Art

In general, the VLC(Variable Length Code), sometimes called as the Hoffmann code, is an optimal code used in a high speed transmission system, to which statistical characteristics of a data is applied, in a manner that once the statistical characteristics of a data are known, the shorter code word is designated, the more frequent video data are generated, and the longer code word is designated, the less frequent video data are generated. If appropriate code words are designated to all possible video data by such a method, an average bit length of code words can be compressed shorter than an originally intended average bit length. Therefore, this VLC is a lossless coding method frequently used for a data of which statistical characteristics are well known.

Figure 1:
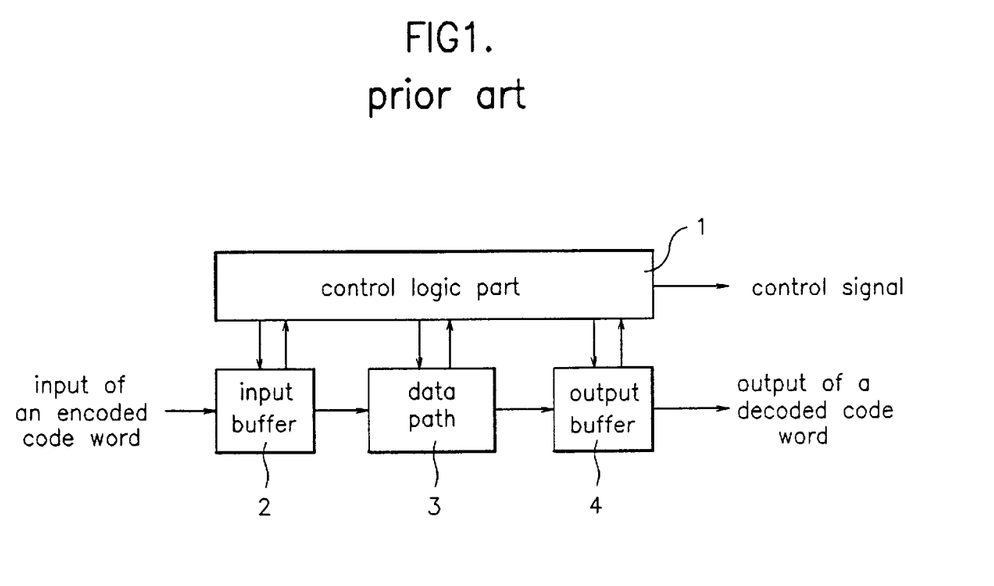
FIG. 1 illustrates a function block diagram of a system including a variable length code decoder.

This VLC is actually employed in systems which require a technique for compressing a video data, such as MPEG 1(Moving Picture Expert Group 1), NEPEG 2(Moving Picture Expert Group 2) and HDTV(High Definition Television) for denser compression of the data. Since faster variable length code decoders come into demand as the time goes by, structures using a PLA(Programmable Logic Array)-based architecture, rather than a tree-based architecture, have been suggested, most of which are focused on reduction of the longest delay time in the variable length code decoder. However, in case the complicated variable length code decoder forms a function block, together with circuits connected thereto and around it in a system, such as NFPEG 1, MPEG 2, or HDTV, the speed of this function block is dependent on the longest delay time existing in parts connecting the variable length code decoder and the circuits around it. Therefore, in providing a variable length code decoder which will form one function block connected with circuits around it in a system, such as MPEG 1, MPEG 2, or HDTV, not only the longest delay time of the variable length code decoder itself, but also the longest delay time existing in parts connecting the variable length code decoder and the circuits around it, should be taken into account. As shown in FIG. 1, an encoded code word(or a data) received at an input buffer 2 is decoded by a data path 3 having a variable length code decoder included therein under the control of a control logic part 1, and produced through an output buffer 4. As seen from above, a variable length code decoder(VLC) in general forms a function block, together with circuits around it connected thereto. In this instant, although an output of the VLC table may be directly stored in an input buffer in another function block, in most cases, the output is applied to one or more circuits around it, or stored in the input buffer of another function block only after being converted into another suitable form in another function block.

Figure 2:
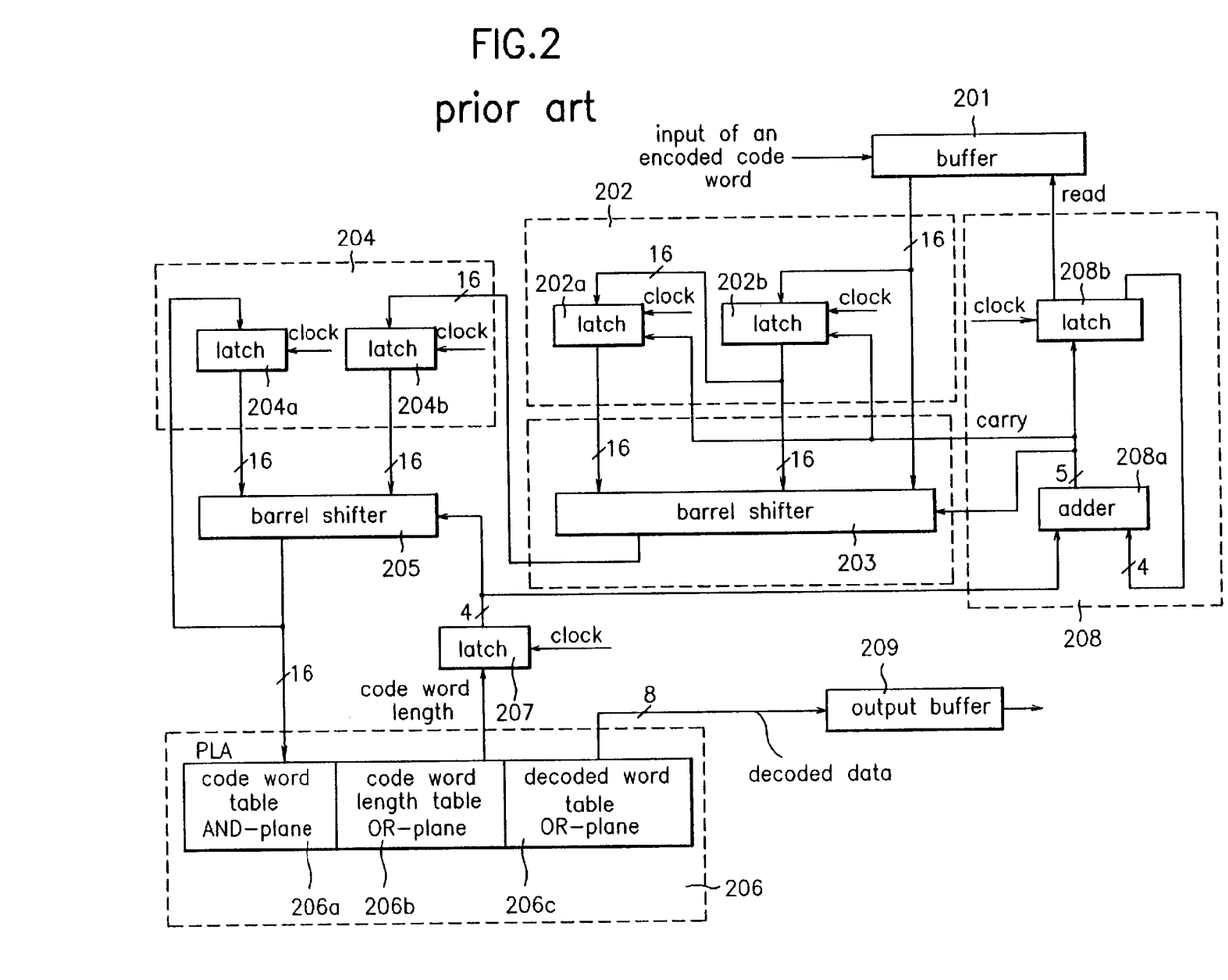
FIG. 2 illustrates a block diagram showing a prior art variable length code decoder.

A prior art device for decoding a variable length code according to a prior art(U.S. Pat. No. 5,245,338) will be explained with reference to FIG. 2. FIG. 2 illustrates a block diagram showing a prior art variable length code decoder.

Referring to FIG. 2, the prior art variable length code decoder includes an input buffer 201, a first latch part 202, a first barrel shifter 203, a second latch part 204, a second barrel shifter 205, a VLC table 206, a first latch 207, a control signal generating part 208 and an output buffer 209. The first latch part 202 includes a second latch 202a and a third latch 202b, the second latch part 204 includes a fourth latch 204a and a fifth latch 204b. The control signal generating part includes an adder 208a and a sixth latch 208b.

Referring to FIG. 2, the VLC table 206 having random logic decodes successive code words continuously to produce decoded code words of a fixed length in response to a read signal of a fixed symbol clock rate. The first latch part 202 and the barrel shifter 203 appropriately interfaces the input buffer 201 with the second latch part 204. The input buffer 201 stores a serial bit stream of code words having variable lengths received from a data channel into a data segment having a fixed length. The control signal generating part 208 produces 16 bit sized data in parallel in response to the read signal from the sixth latch 208b. The VLC table 206 produces a bit length of a code word of an unknown bit length and a decoded code word having the bit length and supplies its output to the latch 207 and the output buffer 209, respectively. The output side of the second barrel shifter 205 provides a decoding window to the VLC table 206 and is controlled by bit lengths of the decoded code words accumulated in the first latch 207 up to a prior clock of the present clock. Code words of variable lengths are provided from the latches 204a and 204b to the second barrel shifter 205. Each of the latches 204a and 204b has a bit capacity at least the length of the longest code word. The second latch part 204 therefore provides successive bits having at least two variable length code words. An output side of the second barrel shifter 205 is connected to an input side of the VLC table 206, to apply bits of the longest code word to be decoded of the successive bits of a length two times the longest code word stored in the fourth latch 204a and the fifth latch 204b wile input data are provided from the input buffer 210 to the first latch part 202 and the first barrel shifter 203. The VLC table 206 applies the length of the code word received from the second barrel shifter 205 to the first latch 207, and the decoded code word to the output buffer 209. At a clock next to the present clock, the second barrel shifter 205 is controlled by the lengths of the code words decoded up to a prior clock received from the first latch 207. Accordingly, an output window of the second barrel shifter 205 is shifted by the bit lengths of the code words decoded up to a prior clock received from the first latch 207, to start from the first bit of a code word to be decoded, newly. Since all the bits in the fourth latch 202a are transformed at all clocks, the fifth latch 204b is filled again with a corresponding bit stream from the first barrel shifter 203 which has an interfacing function during a cycle corresponding to each clock. That is, a successive bit stream starting from the first bit of a decoded code word appears on the input side of the second barrel shifter 205. And, although first barrel shifter 203 provides a bit stream to the fifth latch 204b, this bit stream is not included in the longest delay time because this bit stream is applied to the fifth latch 204b, directly. Thus, the bit stream of code words decoded at a prior clock appeared on the input side of the second barrel shifter 205 should be up-dated during a cycle corresponding to each clock without fail. As explained, an input to the fifth latch 204b is provided from the interfacing first barrel shifter 203. A code word is provided to an input side of the interfacing first barrel shifter 203 from the two successive latches 202a and 202b having a capacity for the longest code word length and the input buffer 201. The interfacing second and third latches 202a and 202b have a bit capacity for the longest code word length which may be produced by the input buffer 201. The output of the first barrel shifter 203 is controlled both by the length of the code word decoded from the output of the VLC table 206 and the output of the adder 208a which adds up the lengths of the code words decoded up to a prior clock of the present clock received from the sixth latch 208a in the control signal generating part 208. The output of the first barrel shifter 203 is shifted according to bit lengths of the decoded code words added up by the adder 208a, to produce outputs of the second barrel shifter 205 and the successive bit streams. A series of bit sequence from the interfacing first barrel shifter 203 appears on the input side of the second barrel shifter 205. When the bit lengths of the decoded code words added up in the adder 208a exceed the longest code word length, a carry is generated. This means that all the bits at storage in the interfacing first latch 202a have been transferred to the fifth latch 204b through the first barrel shifter 203. Because of this carry, all the bits in the third latch 202b are transferred to the second latch 202a, and the code words from the input buffer 201 are transferred to the interfacing second latch 202a. And, new 16 bit size data are simultaneously provided to the third latch 202b and the first barrel shifter 203 from the input buffer 201.

As has been explained, when implementing a high quality picture system, such as MPEG 1, NPEG 2, or HDTV, the variable length code decoder forms a function block, together with circuits around it connected thereto in many cases. And, though the outputs from the VLC table and decoded code bits may be directly stored in input buffers in function blocks different from each another, they are applied to circuits around the VLC table as input data or used as control signals for other function blocks in most cases. Therefore, it is necessary to decode bits of the code words in the shortest time while preventing the trouble from the longest delay time. In this case, the longest delay time of the function block in question exists in parts connecting the VLC decoder with circuits around it, rather than an internal circuit of the VLC decoder itself, which further causes the problem that limits a speed of a fast data transmission system as the circuits around it becomes complicated.

In the meantime, referring to the prior art variable length code decoder shown in FIG. 2, there is the problem that a greater sized VLC decoder is required because the interfacing first barrel shifter 203 and the decoding second barrel shifter 205 are required. Moreover, there has been the problem that a delay time exists in the parts connecting the VLC decoder to the circuits around it through the VLC table 206 and the decoding second barrel shifter 205.

SUMMARY OF THE INVENTION

Accordingly, the present invention is directed to a variable length code decoder that substantially obviates one or more of the problems due to limitations and disadvantages of the related art.

An object of the present invention is to provide a variable length code decoder which can shorten the longest delay time existing in parts connecting a VLC decoder and circuits around it and reduce a chip area of an integrated circuit of a function block in fabrication.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the variable length code decoder includes a storage part for temporary storage and production of an encoded code word in response to a read signal, a switching part for selective production of the code words from the storage part in response to a switching signal, a barrel shifter for shifting a decoding output window thereon in response to a shift signal in producing a predetermined number of bits of the code word from the switching part for decoding, a storage part for temporary storage and production of the code word from the barrel shifter, a table for producing a decoded code word and a bit length of the code word of the predetermined number of bits stored in the storage part, and a control signal generating part for using the bit length of a code word at the present clock received from the table in generating the switching signal, the shift signal and the read signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMODIMENTS

Reference will now be made in detail to the preferred embodiments of the present invention, examples of which are illustrated in the accompanying drawings.

Figure 3:
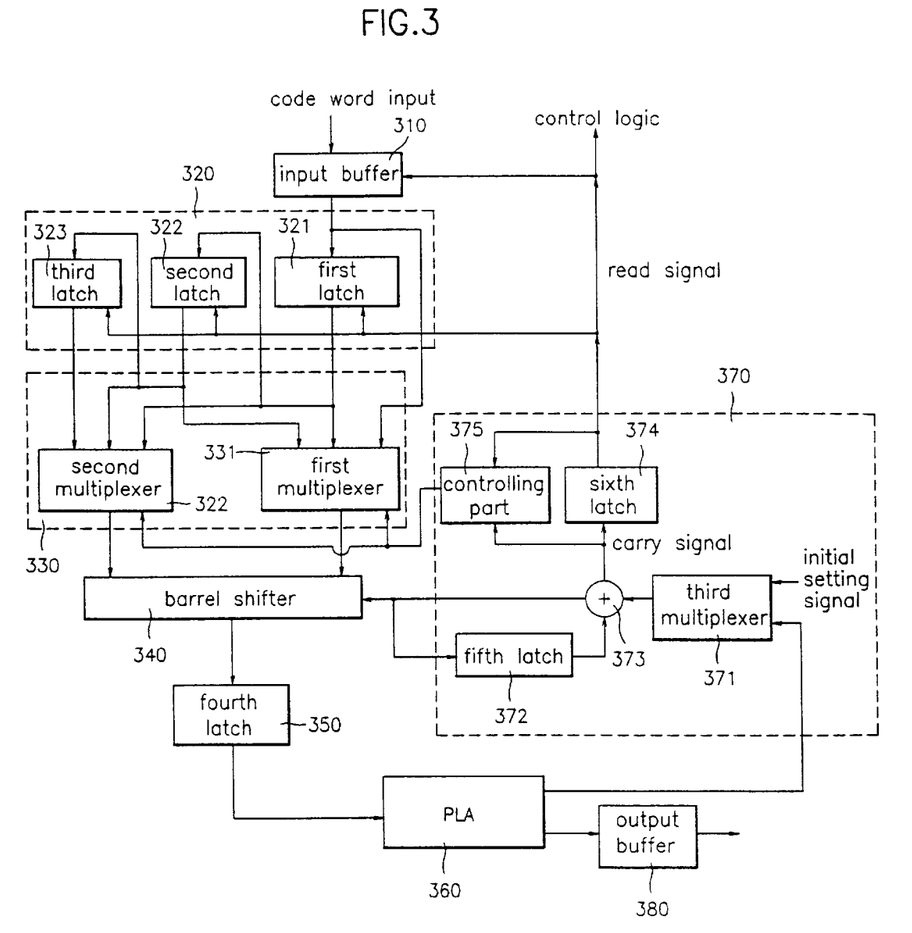
FIG. 3 illustrates a block diagram showing a variable length code decoder in accordance with a first embodiment of the present invention.

FIG. 3 illustrates a block diagram showing a variable length code decoder in accordance with a first embodiment of the present invention.

Referring to FIG. 3, the variable length code decoder in accordance with a first embodiment of the present invention includes an input buffer 310 for storing code words applied thereto in series in parallel by 16 bits and producing the code words in response to a read signal, a latch part 320 for temporary storage and production of the code words received in response to the read signal, a multiplexing part 330 for receiving the code words from the latch part 320 and selectively producing the code words in response to a multiplexing signal, a barrel shifter 340 for shifting an output window thereof in response to a shift signal and for producing a predetermined number of bits of the code words from the multiplexing part 330 for decoding, a latch 350 for temporary storage and production of the code words from the barrel shifter 340, a PLA(Programmable Logic Array) 360 as a VLC table for producing a decoded code word and a bit length of the code word from the latch 350, and a control signal generating part 370 for adding the bit lengths of the decoded code words up to a clock just prior to the present clock and a bit length of the code word from the PLA 360 at the present clock and for using the added bit lengths in providing the read signal, the multiplexing signal and the shift signal to the input buffer 310, the latch part 320, the multiplexing part 330 and the barrel shifter 340, respectively.

The latch part 320 includes a first latch 321 for temporary storage and production of the code words from the input buffer 310 in response to the read signal, a second latch 322 for temporary storage and production of the code words from the first latch 321 in response to the read signal, and a third latch 323 for temporary storage and production of the code words from the second latch 322 in response to the read signal. The multiplexing part 330 includes a first multiplexer 331 for selecting one of the code words from the input buffer 310 and the first and second latches 321 and for 322 in the latch part 320 in response to the multiplexing signal and producing the selected code word as backward 16 bits of the barrel shifter 340, and a second multiplexer 332 for selecting one of the code words from the first, second, and third latches 321, 322 and for 323 in the latch part 320 in response to the multiplexing signal and producing the selected code word as forward 16 bits of the barrel shifter 340. In this case, the multiplexing part 330 acts as a switching part. Therefore, the multiplexing part 330 may be replaced with another device that can act as a switching part. For convenience sake, the latch 350 is called as a fourth latch, hereafter.

The control signal generating part 370 includes a third multiplexer 371 for receiving, selecting and for producing an initial setting signal and selecting a bit length of a code word decoded at the present clock received from the PLA 360, a fifth latch 372 for storing sum of the bit lengths of the code words decoded up to a clock just prior to the present clock, an adder 373 for adding the bit length from the third multiplexer 371 and an output data from the fifth latch 372 to produce the shift signal and a carry signal for shifting the output window of the barrel shifter 340, a sixth latch 374 for temporarily storing the carry signal received from the adder 373 and for producing the stored carry signal as the read signal at the next clock, and a multiplexing controlling part 375 for using the carry signal received from the adder 373 and the read signal received from the sixth latch 324 in producing the multiplexing signal for making the multiplexing part 330 to select one of input terminals thereof Herein, the PLA 360, being a VLC table, is a kind of memory. Accordingly, the PLA 360 can produce a decoded code word and a bit length of a received code word. Therefore, the PLA may be replaced with another device which can act as a memory.

Figure 4:
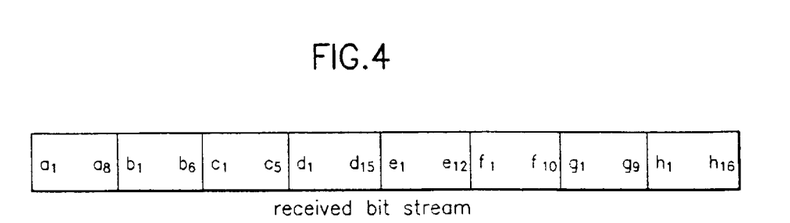
FIG. 4 illustrates a structure of a bit stream applied to the input buffer shown in FIG. 3.
Figure 5:
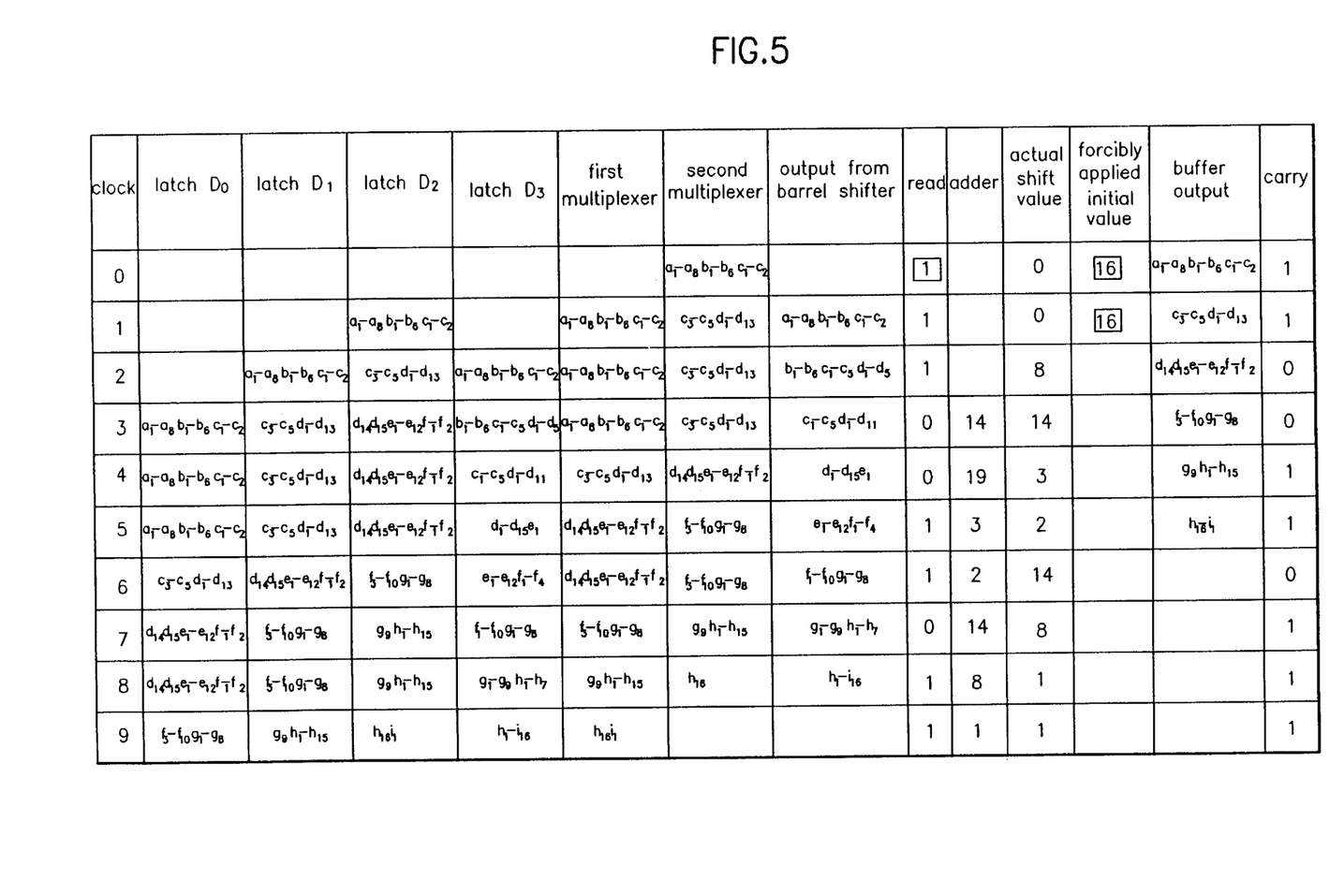
FIG. 5 is a table for explaining operation of the variable length code decoder shown in FIG. 3 at each clock.

The operation of the variable length code decoder in accordance with the first embodiment of the present invention will be explained in detail with reference to FIGS. 4 and 5. FIG. 4 illustrates a structure of a bit stream applied to the input buffer shown in FIG. 3, and FIG. 5 is a table for explaining operation of the variable length code decoder shown in FIG. 3 at each clock.

Code words of variable lengths applied to the input buffer 310 from outside of the input buffer 310 are produced from the input buffer 310 by 16 bits according to a fixed symbol clock rate. The longest bit length of the code words of variable lengths is 16 bits . As well known, the first, second, and third latches 321, 322 and 323 in the latch part 320, being bit registers, each have a capacity for the longest code word. An input to the barrel shifter 340 of 32 bits is provided from the first, and second multiplexers 31 and 332 in the multiplexing part 330, and a 16 bit sliding decoding window is provided as the output window of the barrel shifter 340, the shift of which shift being controlled by the shift signal from the control signal generating part 370. The first multiplexer 331 and the second multiplexer 332 provide backward 16 bits and forward 16 bits to the barrel shifter 340, respectively.

The renewed 16 bit code word from the barrel shift 340 is applied to the PLA 360, which is a kind of memory, through the fourth latch 350. Like the VLC table of FIG. 2, the PLA 360 includes a code word table, a decoded code word table and a code word length table. The code word table in the PLA 360 detects bit patterns of code words stored therein for a code word corresponding to a bit pattern identical to the order of bits of a received code word. The decoded code word table in the PLA 360 produces code words of a fixed length corresponding to the code Words of variable lengths detected in the code word table, that is, decoded code words. And, the code word length table produces bit lengths of the code words of variable lengths detected in the code word table. At generation of the next clock, the code word length from the code word length table in the PLA 360 is added to the bit lengths of the code words decoded up to a previous clock in the adder 373, and this accumulated signal is used as a shifting signal for shifting the output window of the barrel shifter 340. This adder also generates a carry signal, of "1" if the sum of the accumulated code words is longer than the longest bit length of the code word, a carry signal and, of "0" if shorter, and provides the carry signal to the sixth latch 374. If the carry signal from the adder 373 and the read signal from the sixth latch 374 are 0(low) and 0(low), respectively, the multiplexing controlling part 375 provides a multiplexing signal to the first multiplexer 331 and the second multiplexer 332 so that the first multiplexer 331 and the second multiplexer 332 selectively produce the output signal from the second latch 322 and the output signal from the third latch 323 respectively, if the carry signal and the read signal are 1(high) and 0(low), or 0 and 1 respectively, the multiplexing controlling part 375 provides a multiplexing signal to the first multiplexer 331 and the second multiplexer 332 so that the first multiplexer 331 and the second multiplexer 332 selectively produce the output signal from the first latch 321 and the output signal from the second latch 322, respectively. If the carry signal and the read signal are 1(high) and 1(high) respectively, the multiplexing controlling part 375 provides a multiplexing signal to the first multiplexer 331 and the second multiplexer 332 so that the first multiplexer 331 and the second multiplexer 332 selectively produce the output signal from the input buffer 321 and the output signal from the first latch 321, respectively.

For example, let's assumed that a code word having the data stream of FIG. 4 is applied to the input butffer shown in FIG. 3. At generation of a first clock signal, arbitrary 16 bits are forcibly applied to the third multiplexer 371 in the control signal generating part 370 as an initial setting signal to make the carry signal and the read signal "high". At the same time, the input buffer 310 produces 16 bits $a_1$-$a_8 b_1$-$b_6 c_1$-$c_2$ including the first bit of the received code word. The "1" herein means high, and "0" means low. Meanwhile, since the carry signal and the read signal are both 1, the second multiplexer 332 selects a code word from the first latch 321, and the first multiplexer 331 selects a code word from the input buffer 310 in response to a multiplexing signal from the multiplexing controlling part 375. That is, the first multiplexer 331 selects and produces an output signal $a_1$-$a_8b_1$-$b_6c_1$-$c_2$ and the barrel shifter 340, which receives 32 bits, shifts its output window, a sliding decoding window, by 16 bits. In this case, no signal is produced from the barrel shifter 340.

At generation of a second clock signal, arbitrary 16 bits are forcibly applied to the third multiplexer 371 in the control signal generating part 370 as an initial setting signal to make the carry signal "1", and to make the read signal "1" based on the carry signal generated in the adder 373 at the first clock, causing input buffer 310 to produce a code word $c_3$-$c_5d_1$-$d_3$. Because of this, the data $a_1$-$a_8b_1$-$b_6c_1$-$c_2$ produced from the input buffer 310 at the first clock is stored in the second latch 322 by the read signal, and, since all the carry signal and the read signal are 1 and 1, the second multiplexer 332 selectively produces a signal $a_1$-$a_8c_1$-$b_6c_1c_2$ from the first latch 321 in response to the multiplexing signal from the multiplexing controlling part 375 and the first multiplexer 331 selectively produces a signal $c_3$-$c_5d_1$-$d_{13}$. The barrel shifter 340, receiving the signals from the first latch 321 and the input buffer 310, shifts its sliding decoding window by 16 bits from the present state transfers the code word $a_1$-$a_8b_1$-$b_6c_1$-$c_2$ from the first latch 321 to the fourth latch 350.

At generation of a third clock signal, the read signal becomes "1" by the carry signal at the previous second clock, the carry signal becomes "0" because the signal $a_1$-$a_8$ to be decoded actually is of 8 bits, and the input buffer 310 produces the next signal bit stream $d_{14}d_{15}e_1$-$e_{12}f_1f_2$. Since the read signal at the previous second clock signal is "1", the first latch 321 in the latch part 320 stores a data $c_3$-$c_5d_1$-$d_{13}$ from the input buffer 310 at the previous second clock, the second latch 322 stores a data $a_1$-$a_8b_1$-$b_6c_1$-$c_2$ from the first latch 321 at the previous second clock, and the fourth latch 350 stores a data $a_1$-$a_8b_1$-$b_6c_1$-$c_6$ from the barrel shifter 340 at the previous second clock. In this instant, since the carry signal and the read signal are 1 and 0 respectively, the second multiplexer 332 and the first multiplexer 331 select the data $a_1$-$a_8b_1$-$b_6c_1$-$c_2$ from the second latch 322 and the data $c_3$-$c_5d_1$-$d_{13}$ from the first latch 321, respectively, and apply the selected data to the input side of the barrel shifter 340. Upon reception of a signal(or a data) from the first, and second multiplexers 331 and 332, the barrel shifter 340 shifts its sliding decoding window as much as the length $a_1$-$a_8$(8 bits) of the code word decoded at the previous second clock and produces a data $b_1$-$b_6c_1$-$c_5d_1$-$d_5$ in response to the shift signal from the control signal generating part 370. The aforementioned steps are repeated continuously while the variable length code decoder is in operation.

A variable length code decoder in accordance with a second embodiment of the present invention will be explained, hereinafter. A multiplexing part, which has a switching function, is also used in the second embodiment in place of the second barrel shifter used in the prior art.

Figure 6:
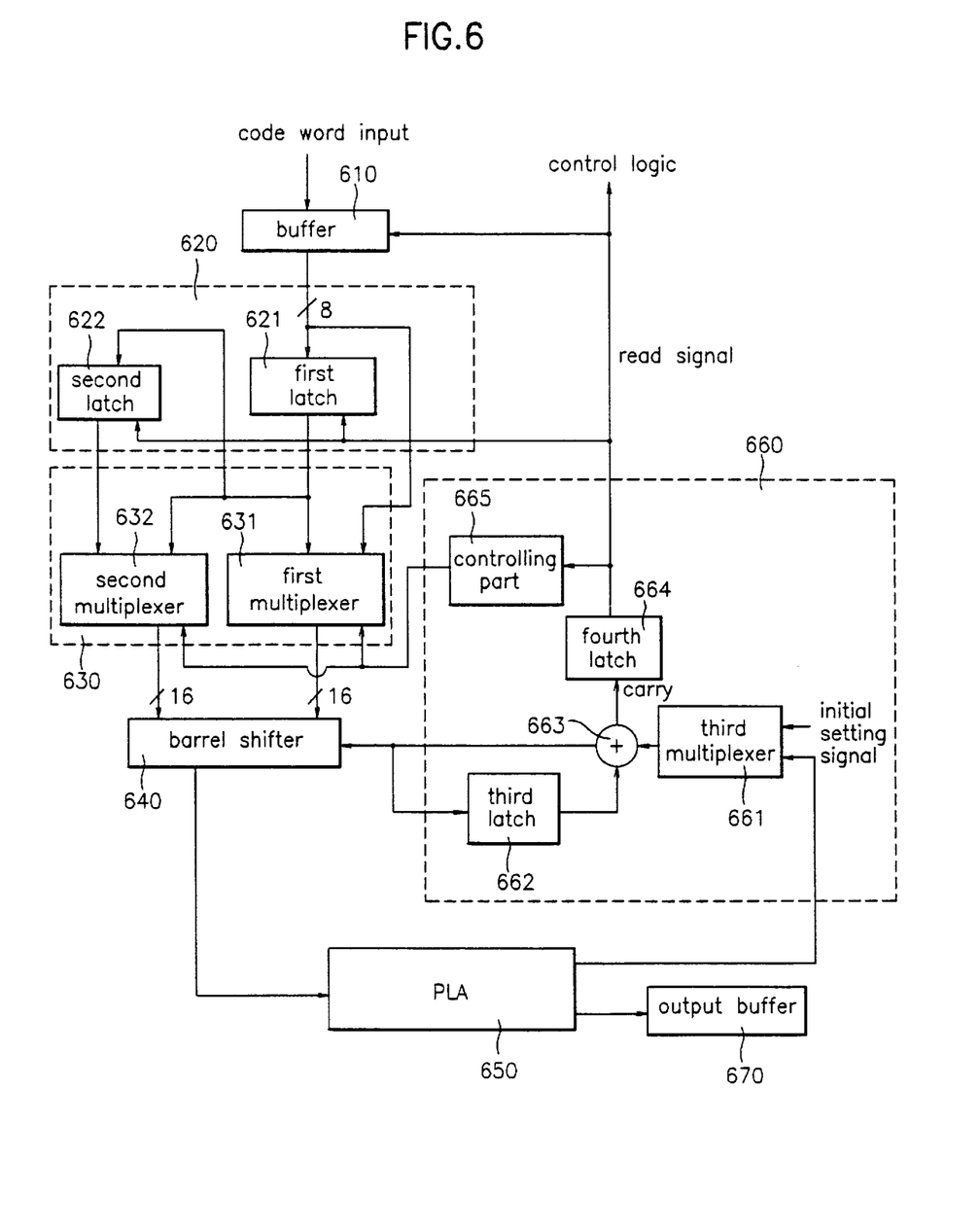
FIG. 6 illustrates a block diagram showing a variable length code decoder in accordance with a second embodiment of the present invention; and, FIG. 7 illustrates a block diagram showing a variable length code decoder in accordance with a third embodiment of the present invention.

FIG. 6 illustrates a block diagram showing the variable length code decoder in accordance with the second embodiment of the present invention.

Referring to FIG. 6, the variable length code decoder in accordance with the second embodiment of the present invention includes an input buffer 610 for making a code word applied thereto in series into parallel code words of 16 bits and producing the parallel code words in response to a read signal, a latch part 620 for temporary storage and production of the code words received from the input buffer 610 in response to the read signal, a multiplexing part 630 for selecting and producing the code words from the latch part 620 and the code words from the input buffer 610 in response to a multiplexing signal, a barrel shifter 640 for shifting a sliding output decoding window by lengths of code words decoded up to a prior clock signal in response to a shift signal and producing a predetermined number of bits(in this case 16 bits) of the code words from the multiplexing part 630, a PLA(Programmable Logic Array) 650 for producing a decoded code word and a bit length of the decoded code word corresponding to the code word from the barrel shifter 640, and a control signal generating part 660 for adding the bit lengths of the decoded code words up to a clock just prior to the present clock and a bit length of the code word decoded at the present clock received from the PLA 650 and using the added bit lengths in providing the read signal, the multiplexing signal and the shift signal.

The latch part 620 includes a first latch 621 for temporary storage and production of the code words from the input buffer 610 in response to the read signal, and a second latch 622 for temporary storage and production of the code words from the first latch 621 in response to the read signal. The multiplexing part 630 includes a first multiplexer 631 for selecting one of the code words from the input buffer 610 and the first latch 621 in the latch part 620 in response to the multiplexing signal and producing the selected code word as backward 16 bits of the barrel shifter 640, and a second multiplexer 632 for selecting one of the code words from the first, and second latches 621 and 622 in the latch part 620 in response to the multiplexing signal and producing the selected code word as forward 16 bits of the barrel shifter 640.

The control signal generating part 660 includes a third multiplexer 661 for receiving and producing an initial setting signal and selecting a bit length of a code word decoded at the present clock received from the PLA 650, a third latch 662 in storage of a sum of the bit lengths of the code words decoded up to a clock just prior to the present clock, an adder 663 for adding the bit length of a code word decoded at the present time received from the third multiplexer 661 and bit lengths of code words decoded up to a clock just prior to the present clock received from the third latch 662 to produce the shift signal and a carry signal, a fourth latch 664 for temporary storage of the carry signal received from the adder 663 and producing the stored carry signal as the read signal at a clock next to the present clock, and a multiplexing controlling part 665 for using the carry signal received from the fourth latch 664 in producing the multiplexing signal for selecting one of input terminals on the multiplexing part 630. The shift signal is a signal for shifting the decoding output window of the barrel shifter 640 by a predetermined number of bits, and the carry signal is a signal of "1" or "0" generated when the output of the adder 663 is greater or smaller than the longest bit length.

The operation of the variable length code decoder in accordance with the second embodiment of the present invention will be explained.

Upon reception of code words of variable lengths in series, the input buffer 610 produces the code words to the first latch 621 by 16 bits in parallel at a constant symbol rate in response to a read signal. The 32 bits is applied to the barrel shifter 640 by the first, and second multiplexers 631 and 632 in the multiplexing part 630. The output window on the barrel shifter 640 is a sliding decoding window for 16 bits. Depending on the read signal from the fourth latch 664 being "0" or "1", the multiplexing controlling part 665 selects on of the two input terminals of the first, and second multiplexers 631 and 632. The "0" and "1" represent a low value and a high value, respectively. Accordingly, the first multiplexer 631 and the second multiplexer 632 produce a code word from the input buffer 610 and a code word from the first latch 621 respectively in response to a multiplexing signal from the multiplexing controlling part 665 if the read signal is "1", and produce a code word from the first latch 621 and a code word from the second latch 622 respectively if the read signal is "0". The renewed 16 bits from the barrel shifter 640 are connected to the PLA 650, which is a VLC table. The PLA 650, being a kind of memory, can be replaced with another device which has a memory function. The system and operation of the PLA 650 are the same with the PLA 360 shown in FIG. 3. That is, the PLA 650 produces a decoded code word corresponding to the 16 bits received from the barrel shifter 640 and produces a length of the decoded code word to the third multiplexer 661 in the control signal generating part 660.

At generation of the next clock signal, the length of the code word decoded at the present clock received from the PLA 640 and bit values of the code words decoded at a clock just prior to the present clock, which is a signal from the third latch 662, are added in the adder 663 and used as a shift signal for shifting the sliding decoding window, which is the output window of the barrel shifter 640, at a clock next to the present clock. In the meantime, the adder 663 produces "0" if the added value is smaller than a bit length value of a preset longest code word, and produces "1" if the added value is greater than a bit length value of the preset longest code word.

The second embodiment variable length code decoder is a model suitable for a case when a fast speed in not required within a variable length code decoder. As shown in FIG. 6, the latch 350 which is included in FIG. 3 is excluded to suit to systems which do not require a fast speed in the decoder.

Figure 7:
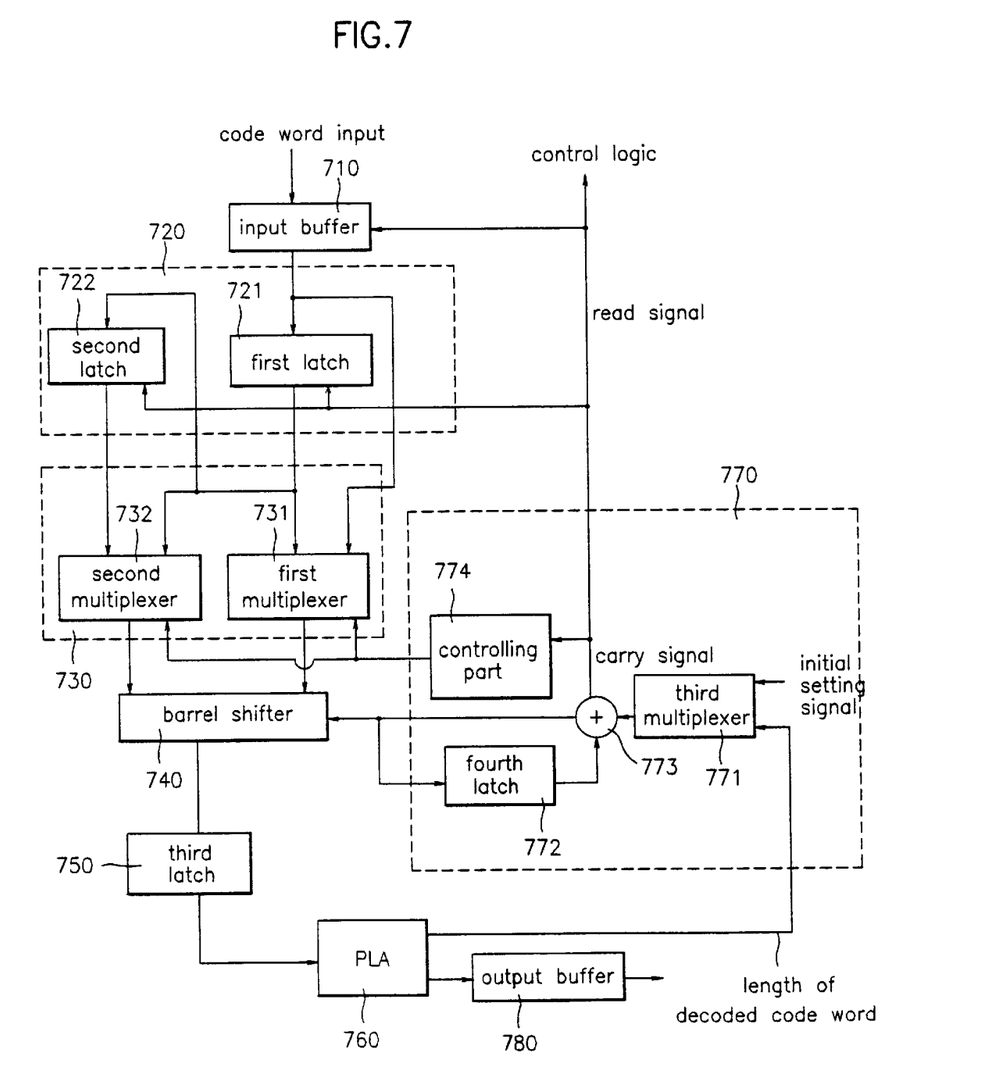

FIG. 7 illustrates a block diagram showing a variable length code decoder in accordance with a third embodiment of the present invention.

Referring to FIG. 7, the variable length code decoder in accordance with the third embodiment of the present invention includes an input buffer 710 for transforming a code word applied thereto in series into parallel code words of 16 bits and producing the parallel code words in response to a read signal, a latch part 720 for temporary storage and production of the code words received from the input buffer 710 in response to the read signal, a multiplexing part 730 for selecting and producing the code words from the latch part 720 in response to a multiplexing signal, a barrel shifter 740 for shifting a sliding decoding window(or an output window) in response to a shift signal and producing a predetermined number of bits of the code word from the multiplexing part 730, a latch 750 for temporary storage and production of the code word from the barrel shifter 740, a PLA(Programmable Logic Array) 760 for producing a decoded code word and a bit length of the decoded code word corresponding to the code word from the latch 750, a control signal generating part 760 for adding a sum of bit lengths of decoded code words up to a clock just prior to the present clock and a bit length of a code word decoded at the present clock received from the PLA 760 and using the added bit lengths in providing the read signal, the multiplexing signal, the carry signal and the shift signal, and an output buffer 780.

The latch part 720 includes a first latch 721 for temporary storage and production of the code words from the input buffer 710 in response to the read signal, and a second latch 722 for temporary storage and production of the code words from the first latch 721 in response to the read signal. The multiplexing part 730 includes a first multiplexer 731 for selecting one of the code words from the input buffer 710 and the first latch 721 in the latch part 720 in response to the multiplexing signal and producing the selected code word as backward 16 bits of the barrel shifter 740, and a second multiplexer 732 for selecting one of the code words from the first, and second latches 721 and 722 in the latch part 720 in response to the multiplexing signal and producing the selected code word as forward 16 bits of the barrel shifter 740. For convenience sake, the latch 750 is called as a third latch.

The control signal generating part 770 includes a third multiplexer 771 for receiving and producing an initial setting signal and receiving and producing a bit length of a code word decoded at the present clock in the PLA 760, a fourth latch 772 in storage of a sum of the bit lengths of the code words decoded up to a clock just prior to the present clock, an adder 773 for adding the code word received from the third multiplexer 771 and the code words received from the fourth latch 772 to produce the shift signal for shifting the output window(or the sliding decoding window) of the barrel shifter 740 and producing "0" if the added value is greater than a preset longest bit length of a code word and "1" if the added value is smaller than the preset longest bit length of a code word, and a multiplexing controlling part 775 for using the read signal received from the adder 773 in producing the multiplexing signal for selecting one of inputs from the first, and second multiplexers 731 and 732.

The third embodiment variable length code decoder having the aforementioned system is used when circuits around the decoder connected with output sides of the decoder for applying the read signal are not complicated.

The operation of the variable length code decoder in accordance with the third embodiment of the present invention will be explained.

The input buffer 710 produces variable length code words received in series in parallel by 16 bits at a constant symbol rate in response to a read signal. The 32 bits from the first, and second multiplexers 731 and 732 in the multiplexing part 730 are applied to an input side of the barrel shifter 740. The output window on the barrel shifter 740 is a sliding decoding window for 16 bits. When the read signal is "1", the first multiplexer 731 and the second multiplexer 732 produce the code word from the input buffer 710 and the code word from the first latch 721 in response to the multiplexing signal provided from the multiplexing controlling part 774 respectively, and when the read signal is "0", the first multiplexer 731 and the second multiplexer 732 produce the code word from the first latch 721 and the code word from the second latch 722 in response to the multiplexing signal provided from the multiplexing controlling part 774, respectively. The output side of the barrel shifter 740 is connected to the third latch 750, and the output side of the third latch 750 is connected with the PLA 760, which is a VLC table. Since the PLA 760 is a kind of memory, the PLA 760 may be replaced with another device which has a memory function.

The system and operation of the PLA 760 are the same with the PLA 360 shown in FIG. 3. That is, the PLA 760 produces a decoded code word and a bit length of the decoded code word corresponding to a received code word.

At generation of a next signal, the bit length of the code word decoded at the present clock received from the PLA 760 and values of the bits of the code words decoded up to a clock just prior to the present clock stored in the fourth latch 772 are added in the adder 773, and directly used for shifting the sliding decoding output window on the barrel shifter 740. And, depending on the state of the read signal(or the carry signal), the multiplexing controlling part 774 provides the multiplexing signal for selecting one from the two input terminals of the first multiplexer 731 and the second multiplexer 732.

As has been explained, the variable length code decoder of the present invention has the following advantages over the decoder of the prior art.

First, the use of the multiplexers instead of the barrel shifter can reduce the area of an integrated circuit on the same delay time basis.

Second, the shortening of the delay time existing between a variable length code decoder and circuits around it facilitates to implement a function block of faster operation speed.

It will be apparent to those skilled in the art that various modifications and variations can be made in the variable length code decoder of the present invention without departing from the spirit or scope of the invention. Thus, it is intended that the present invention cover the modifications and variations of this invention provided they come within the scope of the appended claims and their equivalents.

What is claimed is:

1. A variable length code decoder comprising:
    a first storage part for temporarily storing and producing at least one encoded code word in response to a read signal;
    a switching part for selectively producing a word in response to a switching signal based on the at least one encoded code word produced by the storage part;
    a barrel shifter for shifting a decoding output window in response to a shift signal and for producing a predetermined number of bits of the code word produced by the switching part based on the shifted decoding output window;
    a second storage part for temporarily storing and producing the code word produced by the barrel shifter;
    a table for producing a decoded code word based on the predetermined number of bits stored in the second storage part, and for producing a bit length of the decoded code word; and
    a control signal generating part for generating the switching signal, the shift signal and the read signal based on the bit length of a decoded code word at the present clock received from the table, the control signal generating part including an adder for adding a bit length of a current decoded code word and previously decoded code words to produce a shift signal and a carry signal, and a latch for storing the carry signal and for producing the storage carry signal and a read signal.

2. A variable length code decoder as claimed in claim 1, wherein the table is a programmable logic array.

3. A variable length code decoder as claimed in claim 1, wherein the switching part includes at least one multiplexer.

4. A variable length code decoder as claimed in claim 1, further comprising:
    an input buffer for receiving a serial code word and for applying the code word in parallel units of a predetermined number of bits to the storage part; and
    an output buffer for producing the decoded code word produced by the table as output from the variable length code decoder.

5. A variable length code decoder as claimed in claim 1, wherein the first storage part includes at least one latch.

6. A variable length code decoder as claimed in claim 1, wherein the second storage part comprises a latch connected between the barrel shifter and the table.

7. A variable length code decoder comprising:
    a first latch for temporary storage and production of a received code word in response to a read signal;
    a second latch for temporary storage and production of the code word received from the first latch in response to the read signal;
    a third latch for temporary storage and production of a data received from the second latch in response to the read signal;
    a first multiplexer for receiving the code words from the input buffer and the first, and second latches and selecting and producing one of the code words in response to a multiplexing signal;
    a second multiplexer for receiving the code words from the first, second, and third latches, and selecting and producing one of the code words from the first, second, and third latches in response to the multiplexing signal;
    a barrel shifter for receiving the code word from the first multiplexer as forward bits and the code word from the second multiplexer as backward bits, and shifting an output window thereof in response to a shift signal at producing a code word of a predetermined number of bits;
    a fourth latch for temporary storage and production of the code word from the barrel shifter;
    table for producing a decoded code word and a bit length of the decoded code word corresponding to the code word from the fourth latch;
    a third multiplexer for selectively producing one of the bit length from the table and an initial setting signal;
    a fifth latch in storage of bit lengths of the code words decoded up to a clock just prior to the present clock;
    an adder for adding the bit length from the third multiplexer and the bit lengths from the fifth latch, and using the added value in producing the shift signal and a carry signal;
    a sixth latch for temporary storage of the carry signal and producing the stored carry signal as the read signal; and,
    a multiplexing signal generating part for using the carry signal and the read signal in producing the multiplexing signal.

8. A variable length code decoder as claimed in claim 7, wherein the first multiplexer and the second multiplexer produce the code word from the second latch and the code word from the third latch respectively in response to the multiplexing signal when each of the carry signal and the read signal is at low, produce the code word from the first latch and the code word from the second latch respectively in response to the multiplexing signal when the carry signal and the read signal is at high and low, or low and high respectively, and produce the code word from the first latch and the code word received at the first latch respectively in response to the multiplexing signal when each of the carry signal and the read signal is at high.

9. A variable length code decoder as claimed in claim 7, wherein the table is a programmable logic array.

10. A variable length code decoder as claimed in claim 7, wherein the third multiplexer produces the setting signal when only the setting signal is received at an initial stage, and produces the bit length of the present code word when the bit length is received from the table.

11. A variable length code decoder as claimed in claim 7, further comprising:

an input buffer for producing the code word received in series to the first latch in parallel in response to the read signal; and, an output buffer for producing the decoded code word from the table to outside of the variable length code decoder.

12. A variable length code decoder as claimed in claim 7, wherein the carry signal is at low when the added value is smaller than a preset longest bit length of the code words and at high when the added value is greater than the preset longest bit length of the code words.

13. A variable length code decoder comprising:

a first latch for temporary storage and production of a received code word in response to a read signal;

a second latch for temporary storage and production of the code word received from the first latch in response to the read signal;

a first multiplexer for receiving the code word from the first latch and the code word received at the first latch and selecting and producing one of the code words in response to a multiplexing signal;

a second multiplexer for receiving the code words from the first, and second latches, and selecting and producing one of the code words from the first, and second latches in response to the multiplexing signal;

a barrel shifter for receiving the code word from the first multiplexer as forward bits and the code word from the second multiplexer as backward bits, and shifting an output window thereon in response to a shift signal at producing a code word of a predetermined number of bits;

a table for producing a decoded code word and a bit length of the decoded code word of the code word of a predetermined number of bits from the barrel shifter in response to the code word from the barrel shifter;

a third multiplexer for selectively producing one of the bit length from the table and an initial setting signal;

a third latch in storage of bit lengths of the code words decoded up to a clock prior to the present clock;

an adder for adding the bit length from the third multiplexer and the bit lengths from the third latch to produce the added value as the shift signal and a carry signal;

a fourth latch for temporary storage of the carry signal and producing the stored carry signal as the read signal; and, a multipiexing, signal generating part for using the read signal from the fourth latch in producing the multiplexing signal.

14. A variable length code decoder as claimed in claim 13, wherein the first multiplexer and the second multiplexer produce the code word from the first latch and the code word received at the first latch respectively in response to the multiplexing signal when the read signal is at high, and produce a signal from the first latch and a signal from the second latch respectively in response to the multiplexing signal when the read signal is at low.

15. A variable length code decoder as claimed in claim 13, wherein the table is a programmable logic array.

16. A variable length code decoder as claimed in claim 13, wherein the third multiplexer produces the initial setting signal when only the initial setting signal is received at an initial stage, and produces the bit length when the bit length is received from the table.

17. A variable length code decoder as claimed in claim 13, further comprising:

an input buffer for producing the code word received in series to the first latch in parallel by a predetermined number of bits in response to the read signal; and, an output buffer for producing the decoded code word from the table to outside of the variable length code decoder.

18. A variable length code decoder as claimed in claim 13, wherein the carry signal is at low when the added value is smaller than a preset longest bit length and at high when the added value is greater than the preset longest bit length.

19. A variable length code decoder comprising:

a first latch for temporary storage and production of a received code word in response to a read signal;

a second latch for temporary storage and production of the code word received from the first latch in response to the read signal;

a first multiplexer for receiving the code word from the first latch and the code word received at the first latch and selecting and producing one of the code words in response to a multiplexing signal;

a second multiplexer for receiving the code words from the first, and second latches, and selecting and producing one of the code words from the first, and second latches in response to the multiplexing signal;

a barrel shifter for receiving the code word from the first multiplexer as forward bits and the code word from the second multiplexer as backward bits, and shifting an output window thereon in response to a shift signal at producing a code word of a predetermined number of bits;

a third latch for temporary storage and production of the code word from the barrel shifter;

a table for producing a decoded code word and a bit length of the decoded code word of the code word from the third latch in response to the code word from the third latch;

a third multiplexer for producing one of the bit length from the table and an initial setting signal;

a fourth latch in storage of a sum of bit lengths of the code words decoded up to a clock prior to the present clock;

an adder for adding the initial setting signal or the bit length from the third multiplexer and the bit lengths from the fourth latch to produce the shift signal and a carry signal as the read signal; and, a multiplexing signal generating part for using the carry signal in producing the multiplexing signal.

20. A variable length code decoder as claimed in claim 19, wherein the first multiplexer and the second multiplexer produce the code word from the first latch and the code word received at the first latch respectively in response to the multiplexing signal when the read signal is at high, and produce the code word from the first latch and the code word from the second latch respectively in response to the multiplexing signal when the read signal is at low.

21. A variable length code decoder as claimed in claim 19, wherein the table is a programmable logic array.

22. A variable length code decoder as claimed in claim 19, wherein the third multiplexer produces the initial setting signal when only the initial setting signal is received at an initial stage, and produces the bit length instead of the initial setting signal when the bit length is received from the table.

23. A variable length code decoder as claimed in claim 19, further comprising:

an input buffer for producing the code word received in series to the first latch in parallel in response to the read signal; and,     an output buffer for providing the decoded code word from the table to outside of the variable length code decoder.

24. A variable length code decoder as claimed in claim 19, wherein the carry signal is at low when the added value is smaller than a preset longest bit length of a code word and at high when the added value is greater than the preset longest bit length of the code word.

\* \* \* \* \*